(12) United States Patent
Van Os

(10) Patent No.: US 12,363,847 B2
(45) Date of Patent: Jul. 15, 2025

(54) HOUSING PART FOR A LIGHT GENERATING DEVICE

(71) Applicant: SIGNIFY HOLDING B.V., Eindhoven (NL)

(72) Inventor: Petrus Johannes Maria Van Os, Heeswijk (NL)

(73) Assignee: SIGNIFY HOLDING B.V., Eindhoven (NL)

( * ) Notice: Subject to any disclaimer, the term of this patent is extended or adjusted under 35 U.S.C. 154(b) by 204 days.

(21) Appl. No.: 18/268,863

(22) PCT Filed: Dec. 27, 2021

(86) PCT No.: PCT/EP2021/087671
§ 371 (c)(1),
(2) Date: Jun. 21, 2023

(87) PCT Pub. No.: WO2022/148683
PCT Pub. Date: Jul. 14, 2022

(65) Prior Publication Data
US 2024/0040731 A1 Feb. 1, 2024

(30) Foreign Application Priority Data
Jan. 5, 2021 (EP) .................................. 21150279

(51) Int. Cl.
*H05K 7/14* (2006.01)
*F21V 23/00* (2015.01)
*F21Y 115/10* (2016.01)

(52) U.S. Cl.
CPC ......... *H05K 7/1409* (2013.01); *F21V 23/005* (2013.01); *F21Y 2115/10* (2016.08)

(58) Field of Classification Search
CPC ......... F21V 23/00; F21V 23/005; H05K 7/14; H05K 7/1409; F21Y 2115/10
(Continued)

(56) References Cited

U.S. PATENT DOCUMENTS

| 2015/0189766 A1 | 7/2015 | Fan |
| 2017/0328544 A1 | 11/2017 | Gergely et al. |

(Continued)

FOREIGN PATENT DOCUMENTS

| CN | 200969719 Y | 10/2007 |
| CN | 102591409 A | 7/2012 |

(Continued)

*Primary Examiner* — Tremesha W Burns

(57) ABSTRACT

The invention provides a system (1000) comprising a housing part (400) for clamping an object (20), wherein the housing part (400) comprises a receiving section (430) configured for receiving the object (20), and wherein the housing part (400) comprises a core element (10) configured for clamping the object (20) to the receiving section (430), wherein the core element (10) comprises a monolithic combination of (i) a first plate-like element (200) and (ii) a clamping element (100), wherein the clamping element (100) comprises (a) a main part (150), (b) a lever part (110), (c) a hinge part (120), and (d) a contact part (130), wherein: —the main part (150) is connected to the first plate-like element (200) via the lever part (110) and the hinge part (120); —the lever part (110) in a first state comprises an arch-like shape; —the lever part (110) is connected to the main part (150) at a position between the hinge part (120) and the contact part (130); —the first plate-like element (200) and the clamping element (100) are configured such that relative to the first state, in a second state the main part (150) and the contact part (130) are configured partly pivoted around the hinge part (120).

15 Claims, 8 Drawing Sheets

(58) Field of Classification Search
USPC .......................................................... 361/752
See application file for complete search history.

(56) References Cited

U.S. PATENT DOCUMENTS

| | | |
|---|---|---|
| 2019/0044452 A1 | 2/2019 | Arita et al. |
| 2020/0128684 A1 | 4/2020 | Kupezki |

FOREIGN PATENT DOCUMENTS

| | | |
|---|---|---|
| CN | 206005051 U | 3/2017 |
| EP | 0237093 A1 | 9/1987 |
| GB | 2319397 A | 5/1998 |
| JP | S59103492 U | 7/1984 |
| WO | 2020141115 A1 | 7/2020 |

HOUSING PART FOR A LIGHT GENERATING DEVICE

CROSS-REFERENCE TO PRIOR APPLICATIONS

This application is the U.S. National Phase application under 35 U.S.C. § 371 of International Application No. PCT/EP2021/087671, filed on Dec. 27, 2021, which claims the benefit of European Patent Application No. 21150279.4, filed on Jan. 5, 2021. These applications are hereby incorporated by reference herein.

FIELD OF THE INVENTION

The invention relates to a system comprising a housing part for clamping an object. The invention further relates to a light generating device comprising the system.

BACKGROUND OF THE INVENTION

Systems for fastening an object to a housing are known in the art. For instance, CN200969719Y describes a buckling device for a circuit board, which is composed of a first side plate and two second side plates, and at least one first convex rib is vertically and outstandingly disposed on the first side plate, at least one second convex rib is respectively vertically and outstandingly disposed on two second side plates. Therein, the two second ribs are disposed on the same plane, and an interval distance is disposed between the plane which is provided with the second convex ribs of the two second side plates and the plane which is provided with the first convex rib, when a printed circuit board is disposed in the buckling device for circuit board, the first convex rib is opposite to one side of the printed circuit board, and the second convex rib is opposite to the other side of the printed circuit board, thus the printed circuit board is fixed on the buckling device for circuit board.

US2017/328544 discloses a new lighting/housing fixture comprising a plate/housing plate having multiple snapping clips for holding/assembling LED boards/modules in luminaires/LED light fixtures. The assembly can be made without any fasteners (such as rivets, screws, embossed fasteners, etc.), adhesives or any additional materials. This may be achieved by forming a housing plate comprising a plurality of snapping clips, made from one plate using, e.g., a sheet metal. The snapping clips are able to hold the LED boards in place, using snapped claws, as tight as conventional methods (e.g., using fasteners, rivets, etc.). In addition, the described housing fixture can simplify the assembling procedure, and reduce cost, manpower and maintenance compared to the conventional methods.

US2015/189766 discloses a mounting structure in a power supply chassis which includes a mounting portion and a securing portion. The mounting portion is located on a first sidewall of the power supply chassis. The mounting portion includes a first protruding plate for supporting a circuit board, a second protruding plate parallel to the first protruding plate, and a positioning portion to receive the circuit board. The positioning portion is located between the first protruding plate and the second protruding plate. The securing portion includes a resilient portion extending into the positioning portion. When the circuit board is installed in the power supply chassis, the circuit board is received in the positioning portion and supported by the first protruding plate, with the resilient portion engaged in a securing hole defined in the circuit board.

SUMMARY OF THE INVENTION

Printed circuit board (PCB) may be attached to a housing part via a variety of fixation elements, such as screws, springs, clamps, and brackets, each of which may increase cost and assembly time. The fixation elements may serve both to fixate the PCB to the housing part and to increase (thermal) contact between the PCB and the housing part.

In particular, the prior art may describe a metal leaf spring (especially of spring steel) and a plastic element arranged on a housing part, such that the metal leaf spring can exert a pressure on a PCB via the plastic element (for electrical insulation) such that the PCB is pushed against the housing part to increase thermal contact between the PCB and the housing part. However, such systems may be relatively expensive, may introduce additional steps in preparation of the housing part, and may require a long assembly time.

Hence, it is an aspect of the invention to provide an alternative housing part, which preferably further at least partly obviates one or more of above-described drawbacks. The present invention may have as object to overcome or ameliorate at least one of the disadvantages of the prior art, or to provide a useful alternative.

Hence, in a first aspect, the invention may provide a system comprising a (monolithic) housing part for clamping an object. The housing part may comprise a receiving section configured for receiving (at least part of) the object. In embodiments, the housing part may comprise a core element (or "element") configured for clamping the object to the receiving section. Especially, the core element may comprise a monolithic combination of (i) a first plate-like element and (ii) a clamping element. The clamping element may comprise one or more of (a) a (longitudinal) main part (b) a lever part, (c) a hinge part, and (d) a contact part. In embodiments, the main part may be connected to the first plate-like element via the lever part and the hinge part. In further embodiments, the lever part in a first (unclamping) state (or: "unclamping state") may comprise an arch-like shape. In further embodiments, the lever part may be connected to the main part at a position between the hinge part and the contact part. In further embodiments, the first plate-like element and the clamping element may be configured such that relative to the first state, in a second (clamping) state (or: "clamping state") the main part and the contact part are configured partly pivoted around the hinge part, especially wherein the arch-like shape of the lever part is (at least partially) stretched.

The invention may provide a system for a light generating device comprising a housing part for clamping a printed circuit board, wherein the housing part comprises a receiving section configured for receiving the printed circuit board, and wherein the housing part comprises a core element configured for clamping the printed circuit board to the receiving section, wherein the core element comprises a monolithic combination of (i) a first plate-like element (200) and (ii) a clamping element obtained by removing material from the plate-like element so that a substantial part of its perimeter in the plane of the plate like element is surrounded by open spaces, wherein the clamping element comprises (a) a main part, (b) a lever part, (c) a hinge part, and (d) a contact part, wherein:

the main part having an elongated shape along a longitudinal axis is connected to the first plate-like element via the lever part and the hinge part;

the hinge part is connected to the main part in a longitudinal direction;

the lever part is connected to the main part in a direction perpendicular to the longitudinal direction at a position between the hinge part and the contact part with respect to a longitudinal dimension of the main part;

the lever part is configured to move between a first state and a second state, the lever part in the first state comprises an arch-like shape; in the second state the arch-like shape of the lever part is at least partially stretched; the lever part is configured to move from the first state to the second state by straightening of the lever part; the lever part is configured to move from the second state to the first state by arching the lever part;

the hinge part is configured to act as a pivot point for rotating of the clamping element, (especially the main part and the contact part), over the hinge part;

the receiving section is configured such that the printed circuit board is arranged in a position such that when the clamping element is transitioned from the first state to the second state, the contact part contacts the printed circuit board.

The invention may provide the benefit that no additional components are needed for the system, especially the housing part, to clamp an object (to the receiving section). Further, good thermal contact may be maintained between the object and e.g. the housing part.

In particular, in embodiments the core element may be a monolithic part, especially a monolithic metal part. Especially, in embodiments the housing part may be a monolithic part, especially a monolithic metal part. In specific embodiments, the core element, especially the clamping element, may be provided by removing sections from the housing part (e.g., by cutting them out, such as by laser cutting, water cutting or milling, or by punching, such as using a special made tool or by a general cutting machine, or by spark erosion, etc.). In particular, the clamping effect may be provided through plastic deformation, and especially also due to elastic deformation (of especially the clamping element). In embodiments, the core element, especially the plate-like element, may comprise a sheet-like part, like a plate. This sheet-like part comprises one or more through-holes, especially at least two through holes (and optionally, indentations or thinner parts). For instance, the core element may comprise sheet metal. In embodiments, the core element may comprise a plurality of sheet-like parts, like e.g. walls of a housing. In specific embodiments, the plurality of sheet-like parts may form a monolithic arrangement of sheet-like parts. For instance, a rectangular housing may comprise a plurality of sheet-like parts forming the housing.

In further embodiments, the plate-like element may especially have a plate thickness, which may especially be the smallest dimension of the plate-like element, i.e., the dimension perpendicular to a plane defined by the plate-like element. In further embodiments, the plate thickness may especially be selected from the range of 0.5-4 mm, such as from the range of 1-3 mm.

Further, the system may provide a simple and quick clamping mechanism. By straightening the lever part, the main part and the contact part (of the clamping element) may pivot over the hinge part, i.e., the hinge part may serve as a pivot point along which the main part and the contact part rotate. Thereby, the contact part may move towards the receiving section. In particular, if (at least part of) an object, such as a printed circuit board, is arranged at the receiving section, the contact part may contact the object and may exert a force on the object towards the receiving section. Thereby, the contact part may clamp the object on the receiving section, which may contribute to holding the object in place, and which in particular may improve thermal contact between the object and the receiving section.

Further, the straightened lever may facilitate maintaining the core element, especially the clamping element, in the second state as it may block the main part and the contact part from rotating back (along the hinge part).

Hence, in specific embodiments, the invention may provide a system comprising a (monolithic) housing part for clamping an object, wherein the housing part comprises a receiving section configured for receiving the object, and wherein the housing part comprises a core element configured for clamping the object to the receiving section, wherein the core element comprises a monolithic combination of (i) a first plate-like element and (ii) a clamping element, wherein the clamping element comprises (a) a main part, (b) a lever part, (c) a hinge part, and (d) a contact part, wherein: the main part is connected to the first plate-like element via the lever part and the hinge part; the lever part in a first state comprises an arch-like shape; the lever part is connected to the main part at a position between the hinge part and the contact part; the first plate-like element and the clamping element are configured such that relative to the first state, in a second state the main part and the contact part are configured partly pivoted around the hinge part.

Hence, the invention may provide in embodiments a system comprising a housing part for clamping an object. In embodiments, the system may further comprise (or host) the object (also see below). For instance, the system may comprise an electronic device, and the object may comprise an electrical component. In particular, the system may comprise a lighting system, and the object may comprise a printed circuit board comprising or functionally coupled to a light source, such as a solid state light source.

In embodiments, the system may comprise a housing comprising the housing part, wherein the housing at least partly encloses the object, such as a PCB (see also below). Further, the system may comprise a light source, such as a solid state light source, configured external from the housing, but functionally coupled to the object, such as in embodiments (comprising) a PCB. The system may e.g. comprise in embodiments a luminaire, comprising the housing and the light source. The system may comprise a housing at least partly enclosing the afore-mentioned housing comprising the housing part.

In embodiments, the system may comprise a luminaire, wherein the luminaire comprises the housing comprising the housing part, wherein that housing also may at least partly enclose the light source.

In embodiments, the housing part may be configured to (at least partially) enclose the object. In further embodiments, the housing part may comprise a frame.

The housing part may be configured for housing the object, such as an electrical component, especially a printed circuit board. In particular, the housing part may be configured for clamping (at least part of) the object to a receiving section of the housing part. Hence, the housing part may comprise a receiving section configured for receiving (at least part of) the object.

The term "receiving section" may herein especially refer to a section of the housing part suitable for hosting the object. In particular, the receiving section may be configured such that the object is arranged in a position such that when the clamping element is transition from the first state to the second state, the contact part contacts the object.

The contact part may have an area about the same of the object, or larger, or smaller. In embodiments, the area of the object in (thermal) contact with the receiving section may be at least 5%, such as at least 10%, like at least 15% of the area of the object, such as a PCB.

In embodiments, the housing part may comprise a core element configured for clamping the object to the receiving section. In particular, the housing part may be monolithic, i.e., the core element may be comprised by the monolithic housing part. The term "monolithic" herein may refer to an item consisting of a single piece of material, especially a single piece of metal. Hence, the item may be formed from a single piece of material, such as from a single sheet of metal. In embodiments, the core element may comprise a monolithic combination of (i) a first plate-like element and (ii) a clamping element, i.e., the first plate-like element and the clamping element may (together) form a monolithic combination.

The first plate-like element may especially be an (inner or outer) wall (section) of the housing part. In embodiments, the first plate-like element may be planar, i.e., straight, but in further embodiments it may also be (partially) bent. In particular, the plate-like element may be elongated in a first and second dimension with respect to a third dimension.

In embodiments, the clamping element may be configured for clamping the object to the receiving section. The clamping element may comprise one or more of (a) a (longitudinal) main part (b), a lever part, (c) a hinge part, and (d) a contact part. Especially, the clamping element may comprise the (longitudinal) main part, the lever part, the hinge part, and the contact part.

The main part may be (directly) connected to the lever part, the hinge part and the contact part.

The lever part may be (directly) connected to the main part and the first plate-like element. The lever part may be moveable from a first (unclamping) state to a second (clamping state). In embodiments, the move from the first state to the second state may be reversible. In further embodiments, the move from the first state to the second state may be irreversible.

Hence, the core element, especially the lever part, may during use be moved from the first state to the second state and/or from the second state to the first state. In particular, in embodiments, the core element, especially the lever part, may in the first state be configured moveable to the second state. Similarly, in embodiments, the core element, especially the lever part, may in the second state be configured moveable to the first state.

Moving the core element, especially the lever part, from the second state to the first state may especially comprising arching the lever part, i.e., reversing the straightening of the lever part. In particular, moving the core element, especially the lever part, from the second state to the first state may comprise bending the lever part. By reverting/bending the lever part, the elastic pressure in the core element may result in relaxation of the core element to the first state (especially as the lever part no longer blocks the movement of the main part).

After moving from the second state to the first state from the first state, the first plate-like element and the clamping element may be configured such that relative to the second state, the lever part may bridge a smaller distance, especially a first distance H1 rather than a second distance H2 (also see below). Further, in the second state, the first plate-like element and the clamping element may be configured such that relative to the second state, there is a reduced elastic deformation in the clamping element.

The hinge part may be (directly) connected to the main part and to the first plate-like element. The hinge part may be configured to act as a pivot point for rotating of the clamping element, especially of the main part and the contact part, over the hinge part.

The contact part may, in embodiments, be (directly) connected to the main part. The contact part may be configured for contacting the object. In embodiments, the contact part may have a contact surface for contacting the object. In further embodiments, the contact surface may be smooth. In further embodiments, the contact surface may be ribbed. The contact part may be configured to provide a planar contact surface to the object, i.e., the contact surface may be flat. In further embodiments, however, the contact part may also provide an angled contact surface to the object, such as a rounded contact surface.

Hence, in embodiments, the main part may be connected to the first plate-like element via the lever part and the hinge part.

In further embodiments, in the first state the lever part may comprises an arch-like shape. The term "arch-like shape" may herein especially refer to any two-dimensional shape, wherein relative to two end-points along a first dimension, a middle section (between the two end-points) extends in one direction in a second dimension, especially wherein the largest difference in the second dimension is between one of the two end-points (in the first dimension) and a central point (in the first dimension). For instance, the arch-like shape may be a V-shape, a U-shape, a circular arc, a half period of a sine curve, etc. The arch-like shape may especially allow straightening of the lever part by moving the center of the lever part in the direction of the hinge part. In particular, the lever part may comprise an arch-like shape in the first state, and straightening of the lever part may move the clamping element, especially the lever part, to the second state. Hence, in specific embodiments, the lever part may have a shape selected from the group comprising a V-shape, a U-shape, a circular arc, and a half period of a sine curve, especially a V-shape. In embodiments, the lever part may be connected to the main part at a position between the hinge part and the contact part, especially with respect to a longitudinal dimension of the clamping element, especially with respect to a longitudinal dimension of the main part. Hence, by straightening the lever, the contact part and the main part may pivot along the hinge part.

In embodiments, the first plate-like element and the clamping element may be configured such that relative to the first state, in the second state the main part and the contact part are configured partly pivoted around the hinge part, especially wherein the arch-like shape of the lever part is (at least partially) stretched.

In embodiments, the (monolithic) housing part may comprise the monolithic combination of (i) a first plate-like element and (ii) a clamping element.

The core element, especially the monolithic combination of the first plate-like element and the clamping element, may comprise a plurality of clamping elements. In this way, the clamping elements may clamp an object to the same receiving section.

Alternatively or additionally, the core element may comprise a plurality of monolithic combinations of a first plate-like element and a clamping element. In this way, two or more of the clamping elements of first different plate-like elements may clamp an object on the same receiving section or may clamp an object to different receiving sections or may clamp objects to the same receiving section or clamp objects to different receiving sections.

The clamping element is in embodiments connected to the first plate-like element via the hinge part and one or more lever parts. The clamping element may for a substantial part of its perimeter (especially in the plane of the plate like element) be surrounded by open spaces. These may be obtained by removing material from the plate-like element, like by punching or cutting. The perimeter of the clamping element may comprise at least two parts, a first part ($P_1$) starting from the hinge part to the (first) lever part, and a second part ($P_2$) starting from the (last) lever part further via the contact part to the lever part. The second part is larger than the first part, in embodiments at least twice as large. Further, the open areas in which the clamping element (in the first state) is configured may have a total area that is at least an area of the clamping element, more especially larger than the area of the clamping element.

In embodiments, the system may especially comprise a lighting system. Hence, the system may further comprise a light source, especially a solid state light source, such as an LED light source. The light source may especially be configured to provide light source light.

In embodiments, the system may comprise the object, wherein the object comprises a printed circuit board. Especially, at least part of the printed circuit board may be arranged on the receiving section, especially wherein the core element is in the second state.

In particular, in the second state the contact part may contact the object, especially wherein the contact part exerts a pressure on the object towards the receiving section, i.e., wherein the contact part pushes the object, especially the printed circuit board, onto the receiving section.

Especially, in embodiments the PCB may comprise one or more of a CEM-1 PCE, a CEM-3 PCE, a FR-1 PCE, a FR-2 PCB, a FR-3 PCB, a FR-4 PCB, and aluminum metal core PCB, especially one or more of a CEM-1 PCB, a CEM-3 PCB, a FR-1 PCB, and a FR4 PCB and an aluminum metal core PCB, more especially one or more of a CEM-1 PCB, a CEM-3 PCB, a FR-1 PCB.

The PCB may be functionally coupled to an electrical component, or may be configured to support an electrical component. The electrical component may especially be selected from the group comprising a solid state light source, a driver, an electronic module, or a sensor. Especially, the electrical component may comprise a solid state light source.

The object may comprise a PCB, which may be functionally coupled to a light source. In specific embodiments, the PCB may be configured to support the light source, such as a solid state light source.

In further embodiments, the system may further comprise the light source, especially the solid state light source, such as in embodiments the LED light source. In alternative embodiments the light source may comprise another type of light source, such as a laser diode or a superluminescent diode. Yet, in alternative embodiments the light source may comprise a high pressure lamp, or a gas discharge lamp, a xenon discharge lamp, a Zn discharge based lamp, a sodium discharge based lamp, etc. etc. In such embodiments, the light source may be functionally coupled to the printed circuit board. The term "light source" may also refer to a plurality of (different) light sources.

It will be clear to the person skilled in the art that not every part of an object, such as of a printed circuit board, may be suitable for (directly) contacting the clamping part. Hence, the object may especially comprise a clampable section, wherein the clampable section is configured for contacting the contact part. In particular, in embodiments, when the object is arranged on the receiving section, the clampable section may be arranged such that, when the core element, especially the clamping element, moves from the state to the second state, the contact part contacts the clampable section. Hence, in further embodiments, when the object is arranged on the receiving section, the contact part may contact the clampable section when the core element, especially the clamping element, more especially the lever, is in the second state. For instance, part of the PCB may not be occupied with electrical components, as may be generally the case with edge parts. In other embodiments, the PCB may be designed such that part of the PCB extends from the PCB area, such as a handle like part. For instance, the PCB may have a general rectangular perimeter, with an extending part that extends e.g. a few millimeter from the rectangular perimeter. Further, the PCB may comprise a plurality of extending parts. The area of the extending part(s) may in embodiments (in total) be equal to or less than 15% of the total PCB area (including the extending part(s), like equal to or less than 10%, such as equal to or less than 5%.

As indicated above, the housing part may be a monolithic metal part. Hence, if the object comprises an electrical component, it may be preferable for the housing part and the electrical component to be electrically separated. Hence, in embodiments, the system may comprise an electrically insulating layer arranged between the clamping element and the receiving section.

In further embodiments, the clampable section may be electrically insulated from a second section of the object. For instance, the clampable section may be electrically insulated from a conductive track of the printed circuit board.

In embodiments, the clamping element, especially the main part, may have a longitudinal axis. In particular, the main part may have an elongated shape along the longitudinal axis, i.e., the main part may have a first length $L1$ along the longitudinal axis, and the main part may have a first width $W1$ perpendicular to the longitudinal axis, wherein $L1>W1$, especially wherein $L1\geq1.5*W1$, such as $L1\geq2*W1$, especially $L1\geq3\ W1$. The main part may further have a first thickness $T1$, wherein $T1<W1$, especially wherein $T1\leq0.5*W1$, such as $T1\leq0.2*W1$.

Hence, in embodiments, the main part may have a first width $W1$ perpendicular to a longitudinal axis (A) of the clamping element, especially of the main part.

In embodiments, (at least part of) the hinge part may have a smaller width than the main part to facilitate pivoting around the hinge part. If the width of the hinge part is too large, it may hamper the pivoting. However, if the width of the hinge part is too small, the hinge part may be fragile. Hence, in further embodiments, the hinge part may have a second width $W2$ (parallel to $W1$), and especially wherein the second width $W2$ is the smallest width of the hinge part, wherein $W2\leq0.9*W1$, such as $W2\leq0.8*W1$, especially $W2\leq0.6*W1$, such as $W2\leq0.5*W1$, especially $W2\leq0.4*W1$. In further embodiments, $W2\geq0.1*W1$, such as $W2\geq0.2*W1$, especially $W2\geq0.3*W1$.

The contact part may extend from the main part, especially towards the receiving section. In embodiments, the main part may have a rectangular shape, especially wherein the contact part extends from the rectangular shape.

In particular, in embodiments, the contact part may extend from the main part at an angle α relative to the longitudinal axis (A), wherein $\alpha\geq30°$, especially $\alpha\geq45°$, such as $\alpha\geq60°$, especially $\alpha\geq75°$. In specific embodiments, α may especially be about 90°.

In further embodiments, the contact part may extend from the main part for at least 1 mm, such as at least 2 mm, especially at least 3 mm, such as at least 4 mm. In further embodiments, the contact part may extend from the main part for at most 10 mm, such as at most 8 mm, especially at most 6 mm, such as at most 5 mm. In further embodiments, the contact part may extend from the main part for at least 0.2*W1, such as at least 0.5*W1, especially at least 0.8*W1, such as at least 1*W1. In further embodiments, the contact part may extend from the main part for at most 2*W1, such as at most 1.5*W1, especially at most 1.2*W1, such as at most 1*W1.

In embodiments, in the first state the contact part and the receiving section may be separated by a first clamping distance dc1, and in the second state the contact part and the receiving section may be separated by a second clamping distance dc2, wherein dc2<dc1.

In embodiments, the first clamping distance dc1 is smaller than the first length L1. Hence, in the second state, the second clamping distance dc2 is smaller than the first length. For instance, dc1≤0.5*L1, like especially dc1≤0.2*L1, such as dc1≤0.1*L1.

In embodiments, the lever element may bridge a first distance H1 in the first state, i.e., in the first state the lever element may bridge a first distance H1 between the main part and the first plate-like element. The first distance H1 may especially be defined perpendicular to the longitudinal axis (A).

In further embodiments, the lever element may bridge a second distance H2 in the second state i.e., in the second state the lever element may bridge a second distance H2 between the main part and the first plate-like element. The second distance H2 may especially be parallel to the first distance H1. Further or alternatively, the second distance H2 may be the shortest distance provided by the lever between the first plate-like element and the main part. If the difference H1 to H2 is too small, the clamping element may not provide sufficient clamping force. However, if the difference H1 to H2 is too big, too much deformation may be applied, especially to the hinge part, or especially to the lever part, which may, be detrimental to the longevity of the clamping element. Hence, in further embodiments, 1.05≤H2/H1≤2, such as 1.10≤H2/H1≤1.7, especially 1.15≤H2/H1≤1.4, such as 1.15≤H2/H1≤1.3. In further embodiments, H2/H1≥1.03, such as ≥1.05, especially≥1.08, such as ≥1.0, such as ≥1.2, especially ≥1.5, such as ≥1.17. In further embodiments, H2/H1≤2.0, such as ≤1.8, especially ≤1.6, such as ≤1.5, especially ≤1.4, such as ≤1.35, especially ≤1.3, such as ≤1.25.

In embodiments, the lever element may have a third width (W3), which may in the first state especially be parallel to the longitudinal axis, and which may especially be perpendicular to the first distance (H1), especially wherein the third width (W3) is smaller than the first width (W1).

In embodiments, the clamping element may have a first length L1 defined along the longitudinal axis (A), especially wherein the first length L1 is selected from the range of 5-200 mm, especially from the range of 10-100 mm, such as from the range of 20-80 mm. In further embodiments, L1≥5 mm, such as ≥10 mm, especially ≥15 mm, such as ≥20 mm, especially ≥30 mm. In further embodiments, L1≤200 mm, such as L1≤150 mm, especially L1≤100 mm, such as L1≤80 mm, especially L1≤60 mm, such as L1≤50 mm.

In further embodiments, a first part of the length L1 between the hinge part and the lever part is smaller than a second part of the length L1 between the lever part and the contact part.

In further embodiments, the lever part and the hinge part may be separated by a distance L2 along the longitudinal axis A, especially wherein L2/L1≤0.5, especially ≤0.45, such as ≤0.4. In further embodiments L2/L1≥0.1, such as ≥0.2, especially ≥0.3. The distance L2 may especially be a center-to-center difference (along the longitudinal axis).

In further embodiments, the lever part and the contact part may be separated by a distance L3 along the longitudinal axis A, especially wherein L3/L1≤0.9, especially ≤0.8, such as ≤0.7. In further embodiments L3/L1≥0.3, such as ≥0.5, especially ≥0.6. The distance L3 may especially be a center-to-center difference (along the longitudinal axis).

In embodiments, the clamping element, especially the main body, may further comprise a second hinge part arranged at a position between the lever part and the contact part (with respect to a longitudinal dimension of the clamping element). In further embodiments, the first plate-like element and the clamping element may be configured such that relative to the first state, in the second state the contact part is configured partly pivoted around the second hinge part.

Specifically, the contact part may pivot around the second hinge part upon contacting the object. Hence, the second hinge part may provide an elastic deformation, which may especially exert a pressure onto the object (via the contact part). Thereby, the second hinge part may assist in keeping the core element, especially the lever, in the second state, and the second hinge may increase the pressure exerted onto the object, which may, for example, further improve thermal contact between the object and the receiving section.

In embodiments, the second hinge part may have a fourth width W4 (parallel to the first width W1). In particular, the fourth width W4 may be the narrowest width of the second hinge part. In further embodiments, W4≤0.9*W1, such as W4≤0.8*W1, especially W4≤0.6*W1, such as W4≤0.5*W1, especially W4≤0.4*W1. In further embodiments, W4≥0.1*W1, such as W4≥0.2*W1, especially W4≥0.3*W1. The fourth width may, in embodiments, be similar to the second width. Especially, 0.6≤W2/W4≤1.4, such as 0.7≤W2/W4≤1.3, especially 0.8≤W2/W3≤1.2, such as 0.9≤W2/W3≤1.1.

In contrast to metal leaf springs, the invention may be particularly beneficial with regards to materials with a low modulus of elasticity, i.e., a low Young's modulus. Such materials may more readily remain in the second state. Hence, in embodiments, the housing part may comprise a material selected from the group comprising aluminum, steel, copper, and titanium, especially a material selected from the group comprising aluminum, steel and copper.

Further, as the housing part may be monolithic, it may be preferable for the material to have desirable thermal properties, especially a high thermal conductivity. Hence, in further embodiments, the material may comprise aluminum.

In particular, in further embodiments, the housing part may comprise aluminum. Especially, the housing part may consist of aluminum.

In embodiments, when the core element, especially the lever, is in the second state, the hinge part may be plastically deformed. The term "plastically deformed" may herein refer to having undergone plastic deformation, which may be a type of deformation that is—in contrast to elastic deformation—not undone when the deforming force is removed. Hence, moving of the lever from the first state to the second state may result in plastic deformation of the hinge part.

In embodiments, the first plate-like element may define a virtual plane P, wherein the clamping element may comprise a bend, especially a bend arranged between the (first) hinge part and the contact part, relative to the virtual plane (P). In specific embodiments, the clamping element may comprise a second hinge part. Especially, in such embodiments the clamping element may comprise a bend, especially a bend arranged between the second hinge part and the contact part, relative to the virtual plane (P). Hence, the contact part may be bent away (in the second state) relative to the plate-like element, and may extend from the plate-like element. For instance, the extension relative to the plate-like element may be selected from the range of 0.2-10 mm, such as selected from the range of 0.5-10 mm, like especially selected from the range of 0.5-5 mm.

In embodiments, the first plate-like element may define a virtual plane P, wherein the clamping element comprises a bend, especially a bend arranged between the (first) hinge part and the contact part, at a bend angle $\alpha_b$ relative to the virtual plane (P), wherein $\alpha_b$ is selected from the range of 3°-60°, such as from the range of 5°-45°. Thereby, the contact part may contact an object at a slight offset from the virtual plane P. In particular, the first plate-like element may provide (at least part) of a wall of the housing, and the contact part may contact an object at a distance (perpendicular to the virtual plane P) to the wall.

Further, the bend in the clamping part may broaden the range of objects that may be clamped by the core element, especially by the clamping element. For instance, if the first plate-like part is part of a wall of the housing, wherein the object (during use) abuts the wall, then the object may need a protruding clampable section for the contact part to contact. However, a contact part configured for contacting a clampable section at a distance from the wall (against which the object abuts), may facilitate clamping an object without a protruding clampable section.

In embodiments, the housing part may comprises a heat dissipation part. The heat dissipation part may comprise a thermally conductive material. Especially, in embodiments the heat dissipation part may be selected from the group comprising a heat sink and a heat spreader, especially a heat sink, or especially a heat spreader. In further embodiments, the receiving section may comprise the heat dissipation part or be thermally coupled to the heat dissipation part. Especially the receiving section may comprise the heat dissipation part. Hence, in such embodiments, the clamping of the object to the receiving section, may increase the thermal contact with the heat dissipation part, facilitating cooling of (at least part of) the object.

Instead of the term "thermal contact", also the term "thermally coupled" may be applied. An element may be considered in thermal contact with another element if it can exchange energy through the process of heat. Hence, the elements may be thermally coupled. In embodiments, thermal contact can be achieved by physical contact. In embodiments, thermal contact may be achieved via a thermally conductive material, such as a thermally conductive glue (or thermally conductive adhesive). Thermal contact may also be achieved between two elements when the two elements are arranged relative to each other at a distance of equal to or less than about 10 µm, though larger distances, such as up to 100 µm may be possible. The shorter the distance, the better the thermal contact. Especially, the distance is 10 µm or less, such as 5 µm or less. The distance may be the distanced between two respective surfaces of the respective elements. The distance may be an average distance. For instance, the two elements may be in physical contact at one or more, such as a plurality of positions, but at one or more, especially a plurality of other positions, the elements are not in physical contact. For instance, this may be the case when one or both elements have a rough surface. Hence, in embodiments in average the distance between the two elements may be 10 µm or less (though larger average distances may be possible, such as up to 100 µm). In embodiments, the two surfaces of the two elements may be kept at a distance with one or more distance holders.

A thermally conductive element especially comprises thermally conductive material. A thermally conductive material may especially have a thermal conductivity of at least about 20 W/(m*K), like at least about 30 W/(m*K), such as at least about 100 W/(m*K), like especially at least about 200 W/(m*K). In yet further specific embodiments, a thermally conductive material may especially have a thermal conductivity of at least about 10 W/(m*K).

In embodiments, the thermally conductive material may comprise of one or more of copper, aluminum, silver, gold, silicon carbide, aluminum nitride, boron nitride, aluminum silicon carbide, beryllium oxide, a silicon carbide composite, aluminum silicon carbide, a copper tungsten alloy, a copper molybdenum carbide, carbon, diamond, and graphite. Alternatively, or additionally, the thermally conductive material may comprise or consist of aluminum oxide.

The thermally conductive element may comprise a heatsink. Heatsinks are known in the art. The term "heatsink" (or heat sink) may especially be a passive heat exchanger that transfers the heat generated by device, such as an electronic device or a mechanical device, to a fluid (cooling) medium, often air or a liquid coolant. Thereby, the heat is (at least partially) dissipated away from the device. A heat sink is especially designed to maximize its surface area in contact with the fluid cooling medium surrounding it. Hence, especially a heatsink may comprise a plurality of fins. For instance, the heatsink may be a body with a plurality of fins extending thereof. A heatsink especially comprises (more especially consists of) a thermally conductive material. The term "heatsink" may also refer to a plurality of (different) heatsinks.

In embodiments, the housing may comprise a core element in the second state, i.e., in embodiments the core element may be in the second state (also see below).

In a further aspect, the invention may provide the housing part as such.

In a further aspect, the invention may provide the core element as such. In particular, the invention may provide a core element comprising a monolithic combination of (i) a first plate-like element and (ii) a clamping element for clamping an object; wherein the clamping element comprises (a) a main part (b), a lever part, (c) a hinge part, and (d) a contact part, wherein the main part is connected to the first plate-like element via the lever part and the hinge part; the lever part in a first [unclamping] state comprises an arch-like shape; the lever part is connected to the main part at a position between the hinge part and the contact part; and the first plate-like element and the clamping element are configured such that relative to the first state, in a second state the main part and the contact part (130) are configured partly pivoted around the hinge part.

In embodiments, the core element may be in the second state. In the second state, the hinge part may be plastically deformed. Further, in the second state, the lever part may have a longitudinal shape, such as an arch-like shape wherein two end-points along a first dimension are separated by the second height H2, and wherein a middle section (between the two end-points) extends in one direction in a second dimension for an extension distance $d_e$, wherein $H2 \geq 3*d_e$, such as $\geq 4*d_e$. The second dimension may especially be perpendicular to the first dimension, especially to the second height H2, and especially perpendicular to a plate thickness. Hence, in embodiments, the lever part may essentially have a rectangular shape in the second state. Further, in the second state, the core element may be elastically deformed, especially such that the main part and/or the contact part exert a force towards the lever part, especially to self-reverse the shape change, i.e., due to the elastic deformation, there may be a force in the core element to revert the core element to a relaxed (non-deformed) state. However, the lever part may be configured to prevent the reversion of the deformation. In further embodiments, in the second state, the contact part may be pivoted relative to the main part along the second hinge part. In such embodiments, the core element may further be elastically deformed such that the core element, especially the contact part, provides a force to straighten the core element at the second hinge. In particular, in such embodiments, the contact part may provide a force in a direction opposite of the second height H2 of the lever part, such as in the direction of a receiving section.

In embodiments, the clamping element in the second state may be changed back into the first state (or optionally a state between the second state and the first state. This may be done by deforming the lever part such that the shape is more arch-like than in the second state and by pivoting around the hinge part, such that the contact part moves in the direction of the lever part. When changing from the first state to the second state, the contact part may move in a direction away from the lever part (though when in contact with an object, the clamping element may further be deformed by which the contact part may effectively move closer to the lever part.

In embodiments, the core element may especially comprise aluminum.

In a further aspect, the invention may provide an object comprising a printed circuit board and a protruding clampable section.

In a further aspect, the invention may provide a method for providing the housing part according to the invention, wherein the method comprises removing a part out of a monolithic plate-like element to provide the first plate-like element and (ii) the clamping element. In a further aspect, the invention may provide a method for clamping an object with the system according to the invention. The method may especially comprise: arranging the object at an opposite side of the main part as the lever part; and straightening the lever part, thereby plastically deforming the hinge part, and such that the contact part contacts the object.

In a further aspect, the invention may provide a light generating device comprising the system, especially the housing, according to the invention. In embodiments, the light generating device may especially be selected from the group of a lamp, a luminaire, a projector device, a disinfection device, and an optical wireless communication device.

The light generating device may be part of or may be applied in e.g. office lighting systems, household application systems, shop lighting systems, home lighting systems, accent lighting systems, spot lighting systems, theater lighting systems, fiber-optics application systems, projection systems, self-lit display systems, pixelated display systems, segmented display systems, warning sign systems, medical lighting application systems, indicator sign systems, decorative lighting systems, portable systems, automotive applications, green house lighting systems, horticulture lighting, or LCD backlighting.

In a specific embodiment, the light source comprises a solid state LED light source (such as a LED or laser diode). In alternative embodiments, the light source may comprise a superluminescent diode. The term "light source" may also relate to a plurality of light sources, such as 2-20 (solid state) LED light sources. Hence, the term LED may also refer to a plurality of LEDs.

BRIEF DESCRIPTION OF THE DRAWINGS

Embodiments of the invention will now be described, by way of example only, with reference to the accompanying schematic drawings in which corresponding reference symbols indicate corresponding parts, and in which.

The schematic drawings are not necessarily on scale.

DETAILED DESCRIPTION OF THE EMBODIMENTS

Figure 1A:
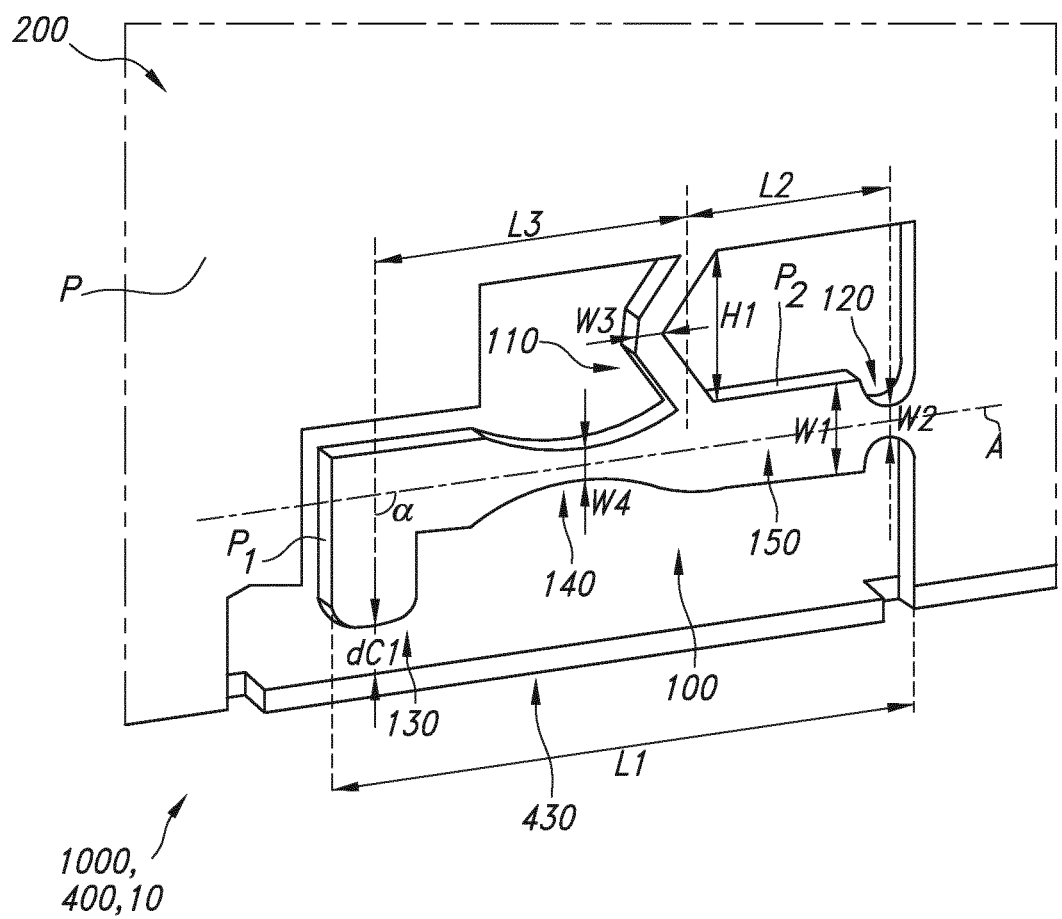
FIG. 1A-D schematically depict embodiments of the system.
Figure 1B:
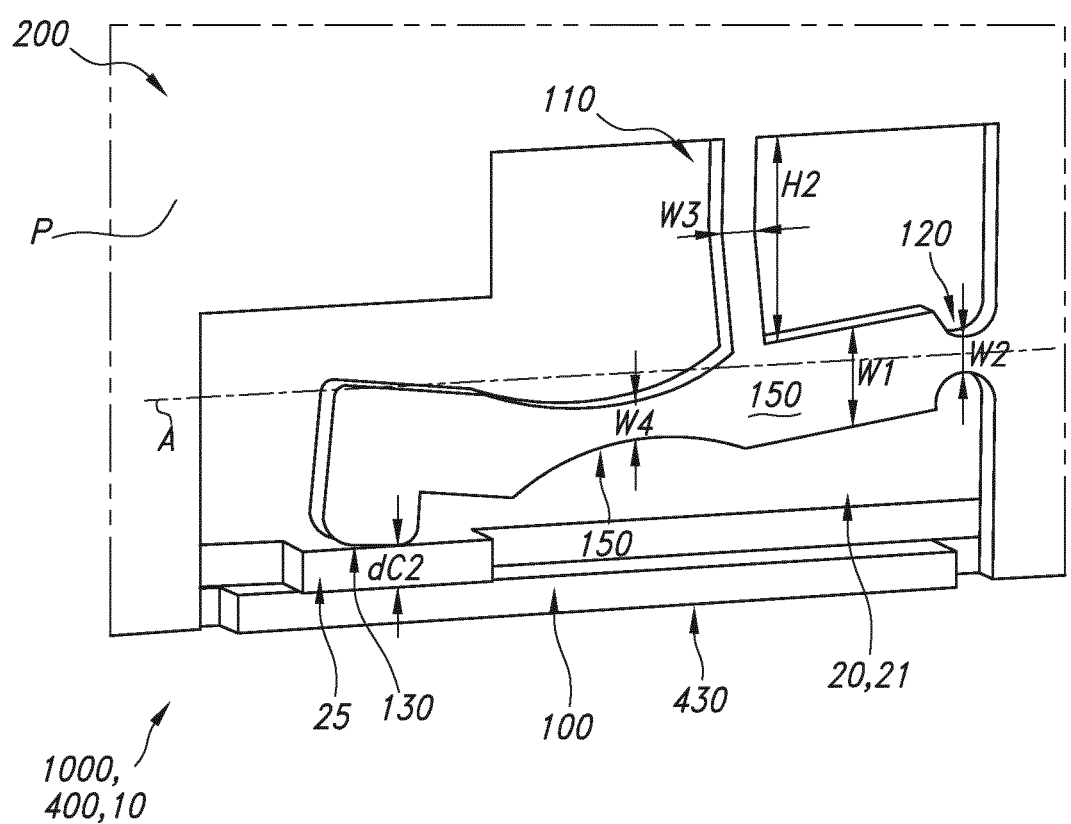
Figure 1C:
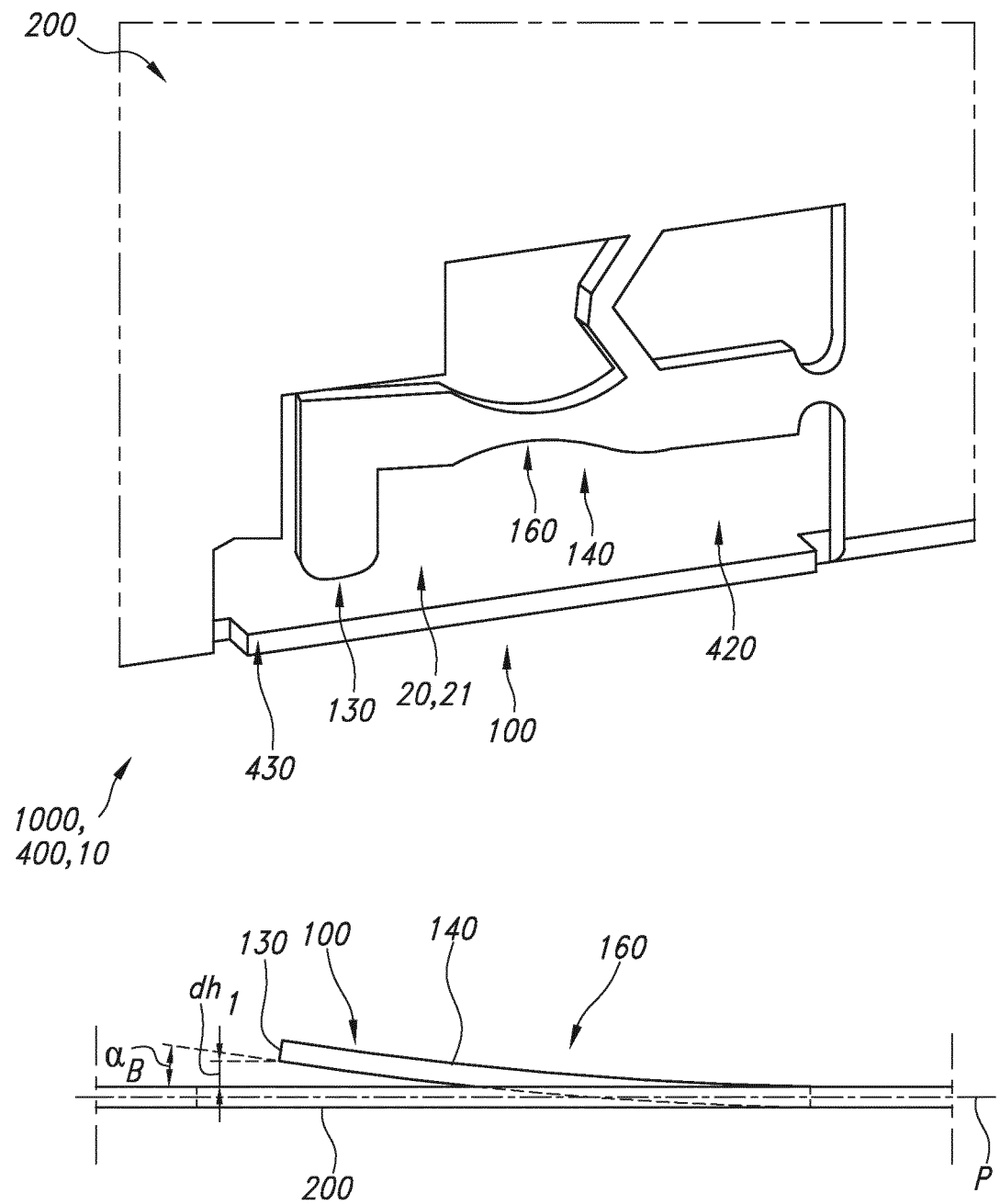

FIG. 1A-C schematically depict a system 1000 comprising a (monolithic) housing part 400 for clamping an object 20, wherein the housing part 400 comprises a receiving section 430 configured for receiving (at least part of) the object 20. In the depicted embodiment, the housing part 400 comprises a core element 10 configured for clamping the object 20 to the receiving section 430, especially wherein the core element 10 comprises a monolithic combination of (i) a first plate-like element 200 and (ii) a clamping element 100. The clamping element 100 comprises a (longitudinal) main part 150, a lever part 110, a hinge part 120, and a contact part 130. In the depicted embodiment: the main part 150 is connected to the first plate-like element 200 via the lever part 110 and the hinge part 120; the lever part 110 in a first (unclamping) state comprises an arch-like shape, especially a V-shape; the lever part 110 is connected to the main part 150 at a position between the hinge part 120 and the contact part 130, especially with respect to a longitudinal dimension of the main part 150; the first plate-like element 200 and the clamping element 100 are configured such that relative to the first state, in a second (clamping) state the main part 150 and the contact part 130 are configured partly pivoted around the hinge part 120.

In particular, FIG. 1A and FIG. 1C schematically depict the clamping element 100, especially the lever 110, in the first state, whereas FIG. 1B schematically depicts the clamping element 100, especially the lever 110, in the second state.

Hence, In FIG. 1B, the arch-like shape of the lever part 110 (as depicted in FIG. 1A) is (at least partially) stretched. Further, in FIG. 1B, the hinge part 120 is plastically deformed.

In the embodiment depicted in FIG. 1A, the main part 150 has a first width W1 perpendicular to a longitudinal axis A of the clamping element 100, and the hinge part 120 has a second width W2, especially parallel to the first width W1. In particular, the second width W2 may be the smallest width of the hinge part 120 parallel to the first width W1. In embodiments, W2≤0.9*W1, such as W2≤0.8*W1, especially W2≤0.6*W1, such as W2≤0.5*W1, especially W2≤0.4*W1. In further embodiments, W2≥0.1*W1, such as W2≥0.2*W1, especially W2≥0.3*W1.

In general, the hinge part 120 may—relative to the main part—be indented towards the longitudinal axis A at two opposite sides. For instance, in the depicted embodiment, the hinge part 120 defines two arch-like shapes, especially two circular arcs. In further embodiments, the hinge part 120 may be indented towards the longitudinal axis A at a single side, especially wherein the hinge part 120 defines an arch-like shape, such as a V-shape.

In embodiments, the contact part 130 may extend from the main part 150 at an angle α relative to the longitudinal axis A, especially wherein α≥30°, such as ≥45°. In the depicted embodiment, a may be about 90°.

If the contact part 130 has a sharp corner, or a sharp tip, it may locally excessively pressure the object 20. Hence, in the depicted embodiment, the contact part 130 has rounded edges. In embodiments, the contact part 130 may have a smooth surface. In further embodiments, the contact part 130 may have a rough surface. In further embodiments, the contact part 130 may have a ribbed surface. The rough surface and the ribbed surface may contribute to keeping the object 20 in place due to increased friction between the contact part 130 and the object 20.

In embodiments, the lever element 110 may bridge a first distance H1 in the first state (see FIG. 1A), especially wherein the first distance H1 is defined perpendicular to the longitudinal axis A, and the lever element 110 may bridge a second distance H2 in the second state (see FIG. 1B), especially wherein the second distance H2 is parallel to the first distance H1, and wherein 1.15≤H2/H1≤1.4.

In the depicted embodiment, the lever element 110 has a third width W3, especially perpendicular to the first distance H1, wherein the third width W3 is smaller than the first width W1, and especially wherein the third width W3 is smaller than the first distance H1.

In the depicted embodiment, the clamping element 100 has a first length L1 defined along the longitudinal axis A, especially wherein the first length L1 is selected from the range of 10-100 mm. In further embodiments, a first part of the first length L1 between the hinge part 120 and the lever part 110 is smaller than a second part of the length L1 between the lever part 110 and the contact part 130. In particular, the lever part and the hinge part may be separated by a (center-to-center) distance L2 along the longitudinal axis A, especially wherein L2/L1≤0.5, especially ≤0.45, such as ≤0.4. In further embodiments L2/L1≥0.1, such as ≥0.2, especially ≥0.3. Similarly, the lever part and the contact part may be separated by a distance L3 along the longitudinal axis A, especially wherein L3/L1≤0.9, especially ≤0.8, such as ≤0.7. In further embodiments L3/L1≥0.3, such as ≥0.5, especially ≥0.6. The distance L3 may especially be a center-to-center difference (along the longitudinal axis). Hence, in embodiments, L3>L2.

In embodiments, in the first state the contact part 130 and the receiving section 430 may be separated by a first clamping distance dc1 (see FIG. 1A), and in the second state the contact part 130 and the receiving section 430 may be separated by a second clamping distance dc2 (see FIG. 1B), wherein dc2<dc1. In particular, FIG. 1B, further depicts an object 20, especially a printed circuit board 21, wherein the contact part 130 contacts the object 20 and pushes the object against the receiving section 430.

FIG. 1B further depicts the clamping element 100, especially the main part 150, further comprising a second hinge part 140 arranged at a position between the lever part 110 and the contact part 130 (with respect to a longitudinal dimension of the main claiming element part 150). In particular, the first plate-like element 200 and the clamping element 100 may be configured such that relative to the first state, in the second state the contact part 130 is configured partly pivoted around the second hinge part 140, i.e., the second hinge part 140 may, in the second state, be elastically deformed, which may result in a higher pressure on the object 20, and may contribute to the clamping element 100 staying in the second state.

In embodiments, the second hinge part 140 may have a fourth width W4 (parallel to the first width W1), especially wherein the fourth width W4 is the narrowest width of the second hinge part 140. In embodiments, the fourth width W4 may be similar to the second width W2, i.e., 0.7≤W2/W4≤1.3.

FIG. 1B schematically depicts an embodiment of the system 1000 comprising an object 20, especially a printed circuit board 21, wherein the object comprises a clampable section 25. In particular, the object comprises a protruding clampable region 25 arranged in a virtual plane defined by the plate-like element 200. Thereby, the clamping element 100, which in the depicted embodiment is in-plane with the plate-like element 200, may contact the object 20 at the clampable section 25.

However, there may be objects without protruding clampable section 25. Hence, in further embodiments, as depicted in FIG. 1C, the clamping element 100 may comprise a bend 160, especially a bend arranged between the hinge part 120 and the contact part 130, especially between the second hinge part 140 and the contact part 130, at a bend angle $α_b$ relative to the first plate-like element 200, especially to a virtual plane defined by the first plate-like element 200, especially wherein $α_b$ is selected from the range of 5-45°. Thereby, the contact part 130 can contact the object 20 at a distance from (the virtual plane defined by) the plate-like element 200. The distance is indicated with reference dh1. In the upper part of FIG. 1C, a perspective (front) drawing is shown, and in the lower part, a top view is shown.

Figure 2A:
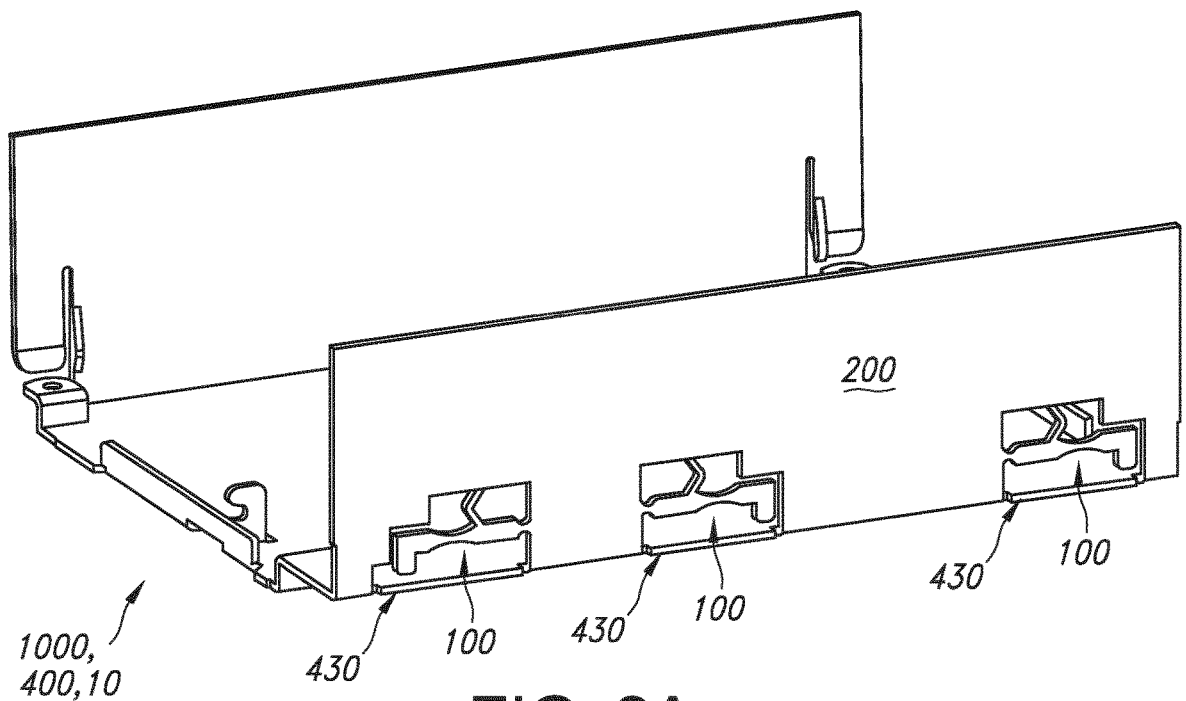
FIG. 2A-F schematically depict further embodiments of the system.
Figure 2B:
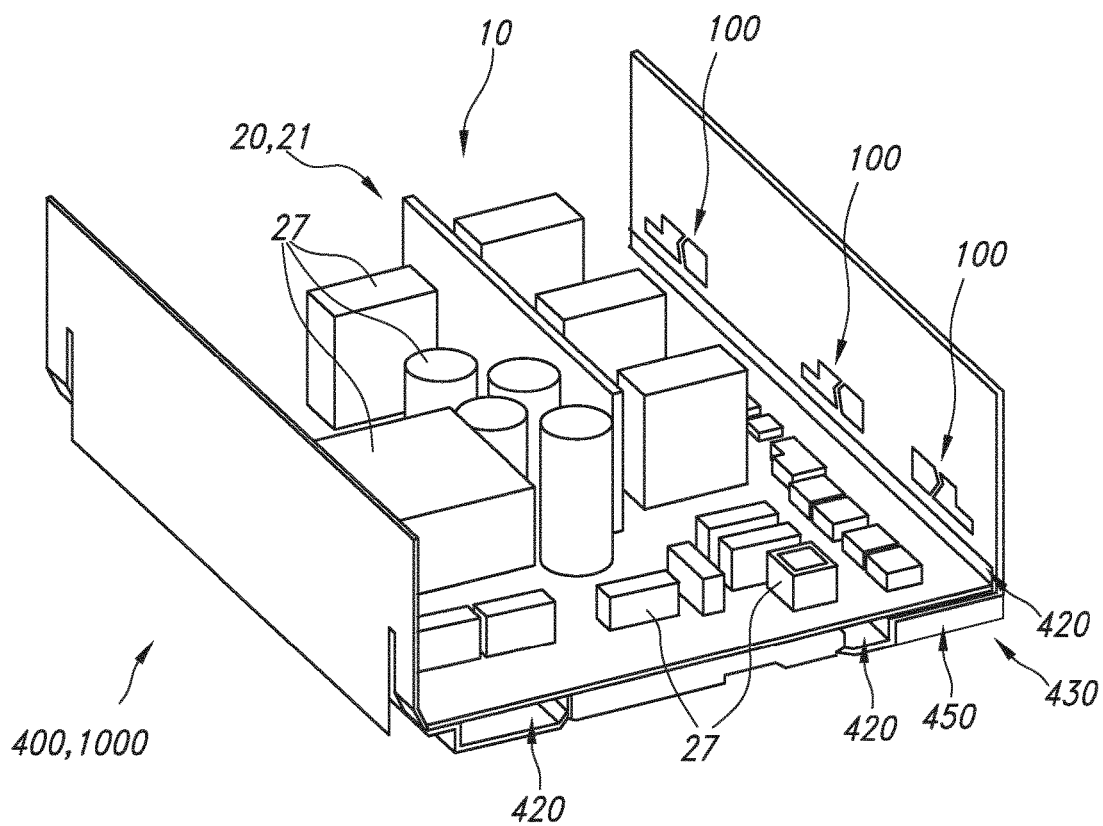

In the depicted embodiment, the system 1000 further comprises an electrically insulating layer 420 arranged between the clamping element and the receiving section 430 (see also FIG. 2B).

Figure 1D:
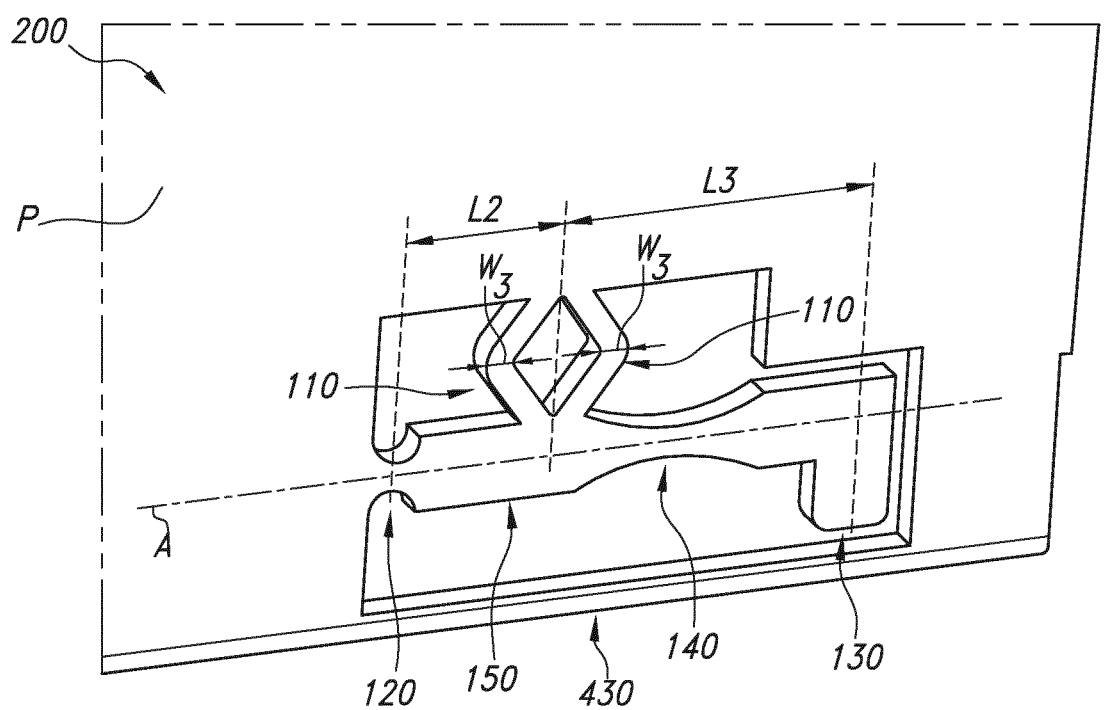

FIG. 1D schematically depicts an embodiment of the system 1000 comprising a plurality of lever parts 110. In particular, in the depicted embodiment, the system 1000 comprises two V-shaped lever parts (in the first state), wherein the tips of the V are arranged opposite to one another. Hence, in embodiments, the system 1000 may comprise two lever parts 110 with arch-like shapes, wherein, in the first state, the lever parts 110 are directed in opposite directions. In particular, the two lever parts 110 may essentially be mirror images. In particular, such an arrangement may further facilitate keeping the clamping element 100 in the second state once the lever parts 110 are straightened.

FIG. 2A schematically depicts an embodiment of the system 1000 comprising a monolithic housing part 400. In particular, the monolithic housing part 400 comprises the plate-like element 200 and the clamping element 100.

FIG. 2B schematically depicts an embodiment wherein the system 1000 comprises the object 20, wherein the object 20 comprises a printed circuit board 21. In the depicted embodiment, at least part of the printed circuit board 21 is arranged on the receiving section 430, and the clamping element 100 is in the second state. In particular, the contact part 130 contacts the object 20, especially thereby pushing the object 20 against the receiving section 430. Reference 27 refers to electrical components. The way in which these are schematically depicts is only by way of example. The object may comprise more or less or differently shaped electronic components.

In further embodiments, the system 1000 may comprise a (solid state) light source 30. The (solid state) light source 30 may especially be functionally coupled to the printed circuit board 21. Further, in embodiments, the (solid state) light source 30 may comprise an LED light source.

FIG. 2B further schematically depicts an electrically insulating layer 420 arranged between the object 20 and the housing 400. In particular, the electrically insulating layer 420 may be arranged between the clamping element 130 and the receiving section 430.

In the depicted embodiment, the system 1000, especially the housing part 400 comprises a heat dissipation part 450, especially a heat sink or a heat spreader, wherein the receiving section 430 is thermally coupled to the heat dissipation part 450.

Figure 2C:
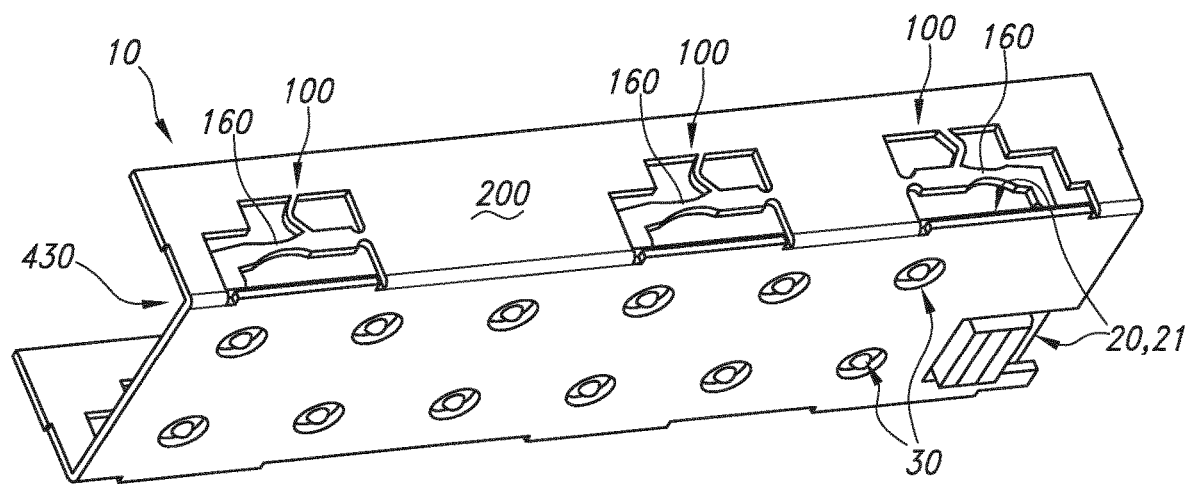

FIG. 2C schematically depicts an embodiment wherein the system comprises the object 20, wherein the object 20 comprises a printed circuit board 21 and a (solid state) light source 30, wherein at least part of the printed circuit board 21 is arranged on the receiving section 430, and wherein the core element 10 is in the second state, wherein the (solid state) light source 30 is functionally coupled to the printed circuit board 21.

Figure 2D:
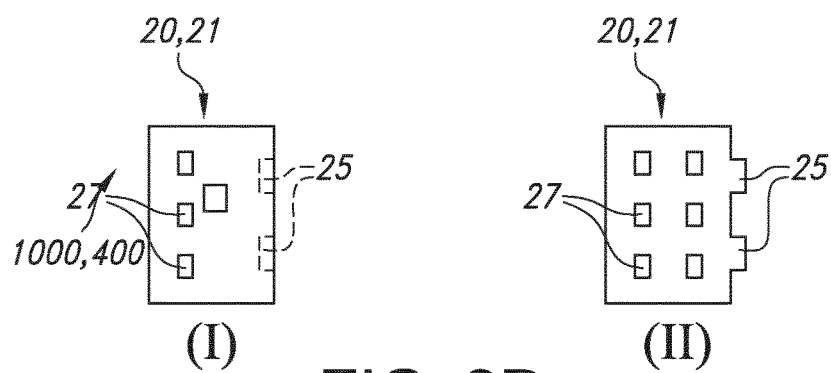

Referring to FIG. 2D, a PCB 21 may comprise a clampable region 25, while the PCB has a rectangular shape, see embodiment I. However, a PCB 21 may comprise a clampable region 25 extending from the PCB having a rectangular shape, see embodiment II. The PCB may comprise a plurality of clampable region 25.

Figure 2E:
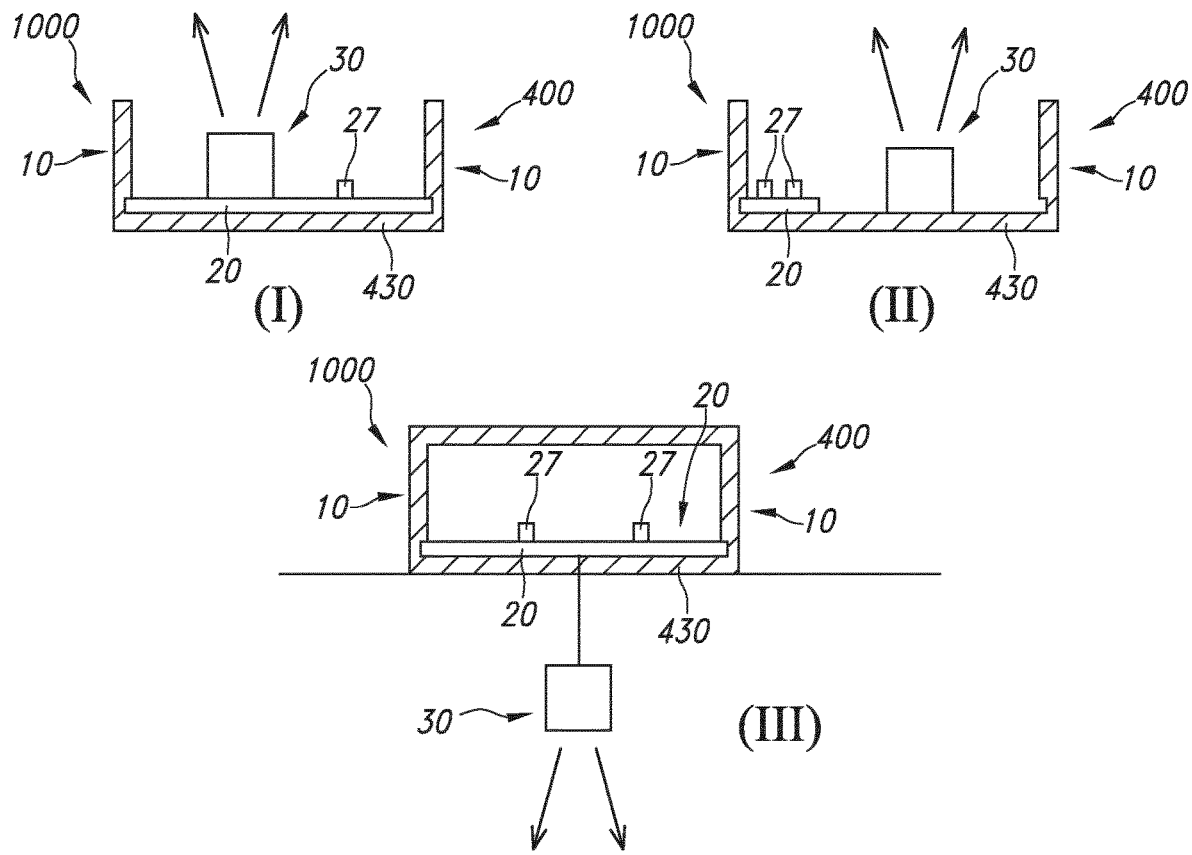

Referring to FIG. 2E in embodiments, the system may comprise a housing comprising the housing part, wherein the housing at least partly encloses the object, such as a PCB, see embodiments I, II and III. The system may e.g. comprise in embodiments a luminaire, comprising the housing and the light source, see embodiments I and II. The system may comprise a housing at least partly enclosing the afore-mentioned housing comprising the housing part, see also embodiments I and II. In embodiments, the system may comprise a luminaire, wherein the luminaire comprises the housing comprising the housing part, wherein that housing also may at least partly enclose the light source; see also embodiments I and II. Further, the system may comprise a light source 30 external from the housing, but functionally coupled to the light source, such as a solid state light source, see embodiment III.

Figure 2F:
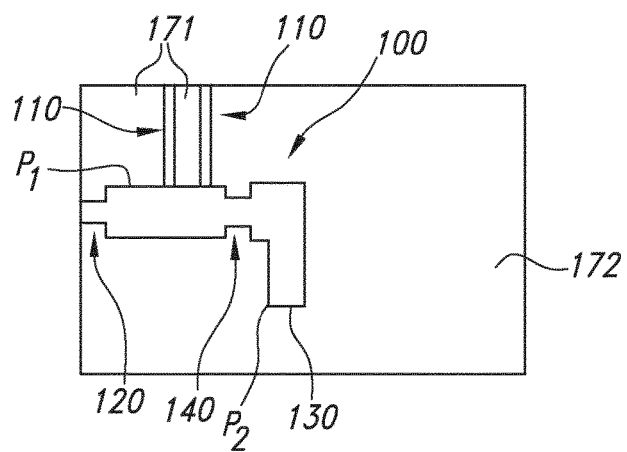

Referring to FIG. 2F, the perimeter of the clamping element may comprise at least two parts, a first part ($P_1$) starting from the hinge part to the (first) lever part, and a second part ($P_2$) starting from (last) lever part further via the contact part to the lever part. The second part is larger than the first part (with regards to volume), in embodiments at least twice as large. Further, the open areas in which the clamping element (in the first state) is configured may have a total area that is at least an area of the clamping element, more especially larger than the area of the clamping element.

Figure 3:
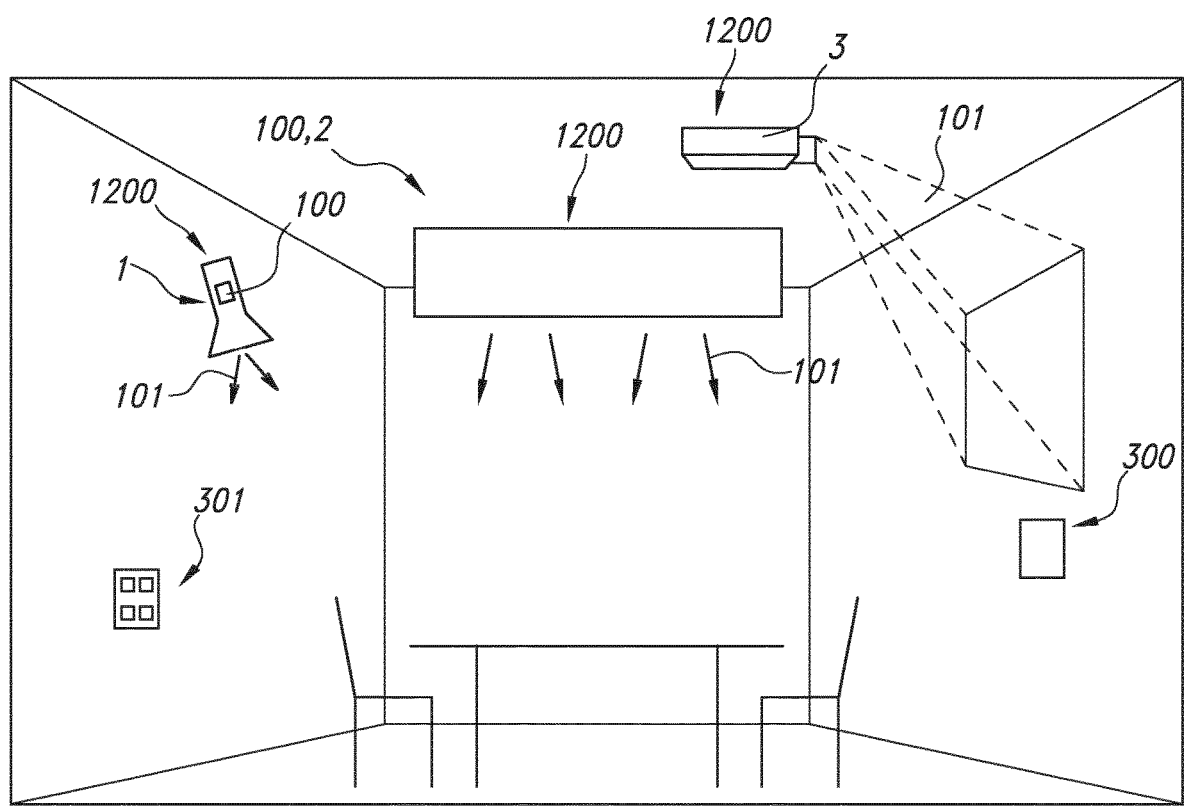
FIG. 3 schematically depicts embodiments of the light generating device.

FIG. 3 schematically depicts an embodiment of a light generating device 1200. In particular, the light generating device 1200 may be selected from the group of a lamp 1, a luminaire 2, a projector device 3, a disinfection device, and an optical wireless communication device. The lighting device 1200 may especially comprise the system 1000 according to the invention. Specifically, FIG. 3 schematically depicts a luminaire 2 comprising the system 1000. Reference 301 indicates a user interface which may be functionally coupled with a control system 300 comprised by or functionally coupled to the system 1000. FIG. 3 also schematically depicts an embodiment of a lamp 1 comprising the system 1000. Reference 3 indicates a projector device or projector system, which may be used to project images, such as at a wall, which may also comprise the system 1000.

The term "plurality" refers to two or more. Furthermore, the terms "a plurality of" and "a number of" may be used interchangeably. The terms "substantially" or "essentially" herein, and similar terms, will be understood by the person skilled in the art. The terms "substantially" or "essentially" may also include embodiments with "entirely", "completely", "all", etc. Hence, in embodiments the adjective substantially or essentially may also be removed. Where applicable, the term "substantially" or the term "essentially" may also relate to 90% or higher, such as 95% or higher, especially 99% or higher, even more especially 99.5% or higher, including 100%. Moreover, the terms "about" and "approximately" may also relate to 90% or higher, such as 95% or higher, especially 99% or higher, even more especially 99.5% or higher, including 100%. For numerical values it is to be understood that the terms "substantially", "essentially", "about", and "approximately" may also relate to the range of 90%-110%, such as 95%-105%, especially 99%-101% of the values(s) it refers to.

The term "comprise" also includes embodiments wherein the term "comprises" means "consists of". The term "and/or" especially relates to one or more of the items mentioned before and after "and/or". For instance, a phrase "item 1 and/or item 2" and similar phrases may relate to one or more of item 1 and item 2. The term "comprising" may in an embodiment refer to "consisting of" but may in another embodiment also refer to "containing at least the defined species and optionally one or more other species". Furthermore, the terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein. The term "further embodiment" and similar terms may refer to an embodiment comprising the features of the previously discussed embodiment, but may also refer to an alternative embodiment.

The devices, apparatus, or systems may herein amongst others be described during operation. As will be clear to the person skilled in the art, the invention is not limited to methods of operation, or devices, apparatus, or systems in operation.

It should be noted that the above-mentioned embodiments illustrate rather than limit the invention, and that those skilled in the art will be able to design many alternative embodiments without departing from the scope of the appended claims.

In the claims, any reference signs placed between parentheses shall not be construed as limiting the claim.

Use of the verb "to comprise" and its conjugations does not exclude the presence of elements or steps other than those stated in a claim. Unless the context clearly requires otherwise, throughout the description and the claims, the words "comprise", "comprising", "include", "including", "contain", "containing" and the like are to be construed in an inclusive sense as opposed to an exclusive or exhaustive sense; that is to say, in the sense of "including, but not limited to". The article "a" or "an" preceding an element does not exclude the presence of a plurality of such elements.

The invention may be implemented by means of hardware comprising several distinct elements, and by means of a suitably programmed computer. In a device claim, or an apparatus claim, or a system claim, enumerating several means, several of these means may be embodied by one and the same item of hardware. The mere fact that certain measures are recited in mutually different dependent claims does not indicate that a combination of these measures cannot be used to advantage. The invention also provides a control system that may control the device, apparatus, or system, or that may execute the herein described method or process. Yet further, the invention also provides a computer program product, when running on a computer which is functionally coupled to or comprised by the device, apparatus, or system, controls one or more controllable elements of such device, apparatus, or system.

The invention further applies to a device, apparatus, or system comprising one or more of the characterizing features described in the description and/or shown in the attached drawings. The invention further pertains to a method or process comprising one or more of the characterizing features described in the description and/or shown in the attached drawings. Moreover, if a method or an embodiment of the method is described being executed in a device, apparatus, or system, it will be understood that the device, apparatus, or system is suitable for or configured for (executing) the method or the embodiment of the method, respectively.

The various aspects discussed in this patent can be combined in order to provide additional advantages. Further, the person skilled in the art will understand that embodiments can be combined, and that also more than two embodiments can be combined. Furthermore, some of the features can form the basis for one or more divisional applications.

The invention claimed is:

1. A system for a light generating device comprising a housing part for clamping a printed circuit board, wherein the housing part comprises a receiving section configured for receiving the printed circuit board, and wherein the housing part comprises a core element configured for clamping the printed circuit board to the receiving section, wherein the core element comprises a monolithic combination of (i) a first plate-like element and (ii) a clamping element wherein a substantial part of its perimeter in the plane of the plate-like element is surrounded by open spaces, wherein the clamping element comprises (a) a main part, (b) a lever part, (c) a hinge part, and (d) a contact part, wherein: the main part is connected to the first plate-like element via the lever part and the hinge part; the hinge part is connected to the main part; the lever part is connected to the main part at a position between the hinge part and the contact part; the lever part is configured to move between a first state and a second state, the lever part in the first state comprises an arch-like shape; in the second state, the arch-like shape of the lever part is at least partially stretched; the lever part is configured to move from the first state to the second state by straightening of the lever part; the lever part is configured to move from the second state to the first state by arching the lever part; the hinge part is configured to act as a pivot point for rotating of the clamping element over the hinge part; the receiving section is configured such that the printed circuit board is arranged in a position such that when the clamping element is transitioned from the first state to the second state, the contact part contacts the printed circuit board.

2. The system according to claim 1, wherein the system comprises an object, wherein the object comprises the printed circuit board, wherein the system further comprises a light source functionally coupled to the printed circuit board, wherein at least part of the printed circuit board is arranged on the receiving section, and wherein the core element is configured in the second state.

3. The system according to claim 2, wherein the light source comprises a solid state light source.

4. The system according to claim 1, wherein the system further comprises an electrically insulating layer arranged between the clamping element and the receiving section.

5. The system according to claim 1, wherein the main part has a first width W1 perpendicular to a longitudinal axis (A) of the clamping element, and wherein the hinge part has a second width W2, wherein $W2 \leq 0.5 \ast W1$.

6. The system according to claim 5, wherein the contact part extends from the main part at an angle α relative to the longitudinal axis (A), wherein $\alpha \geq 45°$.

7. The system according to claim 5, wherein the lever element bridges a first distance (H1) in the first state, and wherein the lever element bridges a second distance (H2) in the second state, and wherein $1.15 \leq H2/H1 \leq 1.4$.

8. The system according to claim 5, wherein the clamping element has a first length L1 defined along the longitudinal axis (A), wherein the first length L1 is selected from the range of 10 mm-100 mm; and wherein a first part of the length L1 between the hinge part and the lever part is smaller than a second part of the length L1 between the lever part and the contact part.

9. The system according to claim 5, wherein in the first state, the contact part and the receiving section are separated by a first clamping distance dc1, and wherein in the second state, the contact part and the receiving section are separated by a second clamping distance dc2, wherein $dc2 < dc1$.

10. The system according to claim 5, wherein the clamping element further comprises a second hinge part arranged at a position between the lever part and the contact part, wherein:

the first plate-like element and the clamping element are configured such that relative to the first state, in the second state the contact part is configured partly pivoted around the second hinge part.

11. The system according to claim 5, wherein the housing part comprises aluminum.

12. The system according to claim 5, wherein in the second state, the hinge part is plastically deformed.

13. The system according to claim 5, wherein the first plate-like element defines a virtual plane (P), wherein the clamping element comprises a bend at a bend angle ab relative to the virtual plane (P), wherein ab is selected from the range of 5-45°.

14. The system according to claim 5, wherein the housing part comprises a heat dissipation part, wherein the receiving section comprises the heat dissipation part or wherein the receiving section is thermally coupled to the heat dissipation part.

15. A light generating device selected from the group of a lamp, a luminaire, a projector device, a disinfection device, and an optical wireless communication device, comprising the system according to claim 5.

* * * * *